United States Patent
Shoji (10) Patent No.: US 7,897,950 B2
(45) Date of Patent: Mar. 1, 2011

(54) MAGNETIC MEMORY, A METHOD OF MANUFACTURING THE SAME, AND SEMICONDUCTOR INTEGRATED CIRCUIT APPARATUS

(75) Inventor: Mitsuharu Shoji, Kanagawa (JP)

(73) Assignee: Sony Corporation, Tokyo (JP)

( * ) Notice: Subject to any disclaimer, the term of this patent is extended or adjusted under 35 U.S.C. 154(b) by 676 days.

(21) Appl. No.: 11/700,205

(22) Filed: Jan. 31, 2007

(65) Prior Publication Data
US 2007/0181964 A1  Aug. 9, 2007

(30) Foreign Application Priority Data
Feb. 8, 2006 (JP) ............................ P2006-030577

(51) Int. Cl.
*H01L 47/00* (2006.01)
(52) U.S. Cl. ........................ 257/2; 257/3; 257/4; 257/5; 257/9; 257/E45.002; 257/E45.003
(58) Field of Classification Search ............... 257/4, 257/5, 9, E21.665, 2–3
See application file for complete search history.

(56) References Cited

U.S. PATENT DOCUMENTS
2005/0057992 A1 * 3/2005 Yagami ................... 365/222

FOREIGN PATENT DOCUMENTS
JP    2005-150482    6/2005

* cited by examiner

*Primary Examiner*—Kiesha R Bryant
*Assistant Examiner*—Minchul Yang
(74) *Attorney, Agent, or Firm*—Rader, Fishman & Grauer PLLC (57) ABSTRACT

A magnetic memory includes a magnetic tunneling junction element having a reference layer, a tunnel barrier layer and a recording layer laminated in order, with information being written to the recording layer in accordance with spin injection magnetization reversal caused by a current, and information written to the recording layer being read out using a current. The magnetic tunneling junction element is disposed on a plug connected to a selection transistor, and a sidewall insulating film covering a side portion of the recording layer of the magnetic tunneling junction element is formed.

3 Claims, 10 Drawing Sheets

ENLARGED VIEW OF MTJ

MAGNETIC MEMORY, A METHOD OF MANUFACTURING THE SAME, AND SEMICONDUCTOR INTEGRATED CIRCUIT APPARATUS

CROSS REFERENCES TO RELATED APPLICATIONS

The present invention contains subject matter related to Japanese Patent Application JP 2006-030577 filed with the Japanese Patent Office on Feb. 8, 2006, the entire contents of which being incorporated herein by reference.

BACKGROUND OF THE INVENTION

1. Field of the Invention

The present invention relates to a magnetic memory utilizing spin injection magnetization reversal caused by a current, a method of manufacturing the same, and a semiconductor integrated circuit apparatus having the same installed therein.

2. Description of the Related Art

Figure 10:
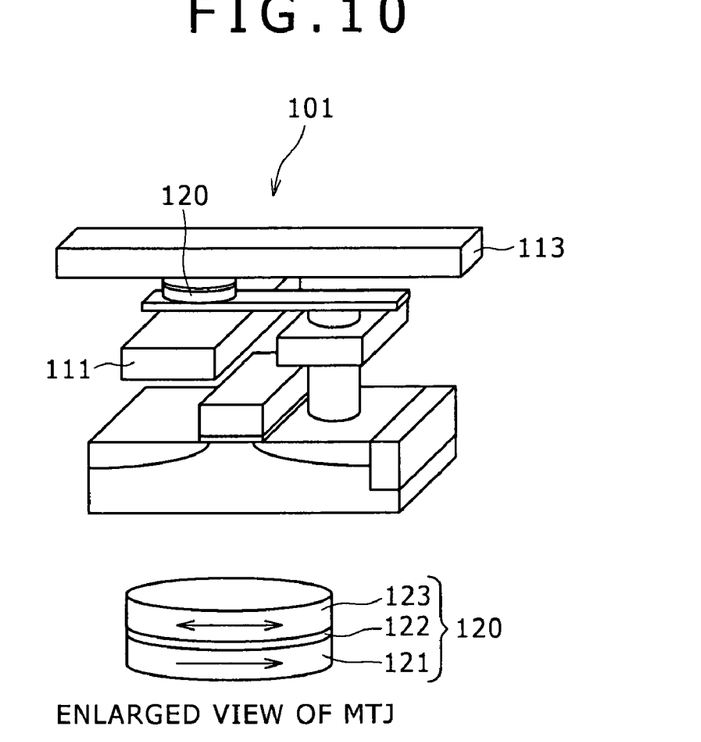
FIG. 10 is a schematic perspective view showing a structure of a MRAM in the past.

As shown in FIG. 10, a magnetic random access memory (MRAM) in related art as one kind of non-volatile memory using a magneto-resistance effect generally has a structure in which a magnetic tunneling junction (MTJ) element is formed between a write word line 111 and a bit line 113. Here, the MTJ element has a lamination structure including a reference layer (magnetization fixing layer) 121, a tunnel barrier layer 122, and a recording layer (magnetization free layer) 123. Also, the MRAM carries out a write operation by using a magnetic field generated by a current. The two arrows in the figure indicate the magnetization directions of the reference layer 121 and the recording layer 123, respectively. In the MRAM 101 having this structure, when a memory cell is made smaller in order to increase the storage capacity e.g., Japanese Patent Laid-open No. 2005-150482, there is encountered a problem that the magnitude of a reversed magnetic field abruptly increases and the necessary current also abruptly increases with the increase in reversed magnetic field. In addition, when the size of the memory cell becomes equal to or smaller than the 200 nmϕ demanded to cause the storage capacity to exceed a gigabit (Gbit), the allowable current density of a wiring is exceeded, and it becomes difficult to write information any more. This is another problem.

On the other hand, spin injection magnetization reversal is known in which magnetization reversal is caused by supporting a polarized spin current (spin injection). This spin injection magnetization reversal has the feature that a current demanded for the magnetization reversal is reduced as the memory cell size becomes smaller. From a viewpoint of this aspect, this spin injection magnetization reversal is suitable for manufacturing a magnetic memory having a high integration level and a large capacity.

Figure 11:
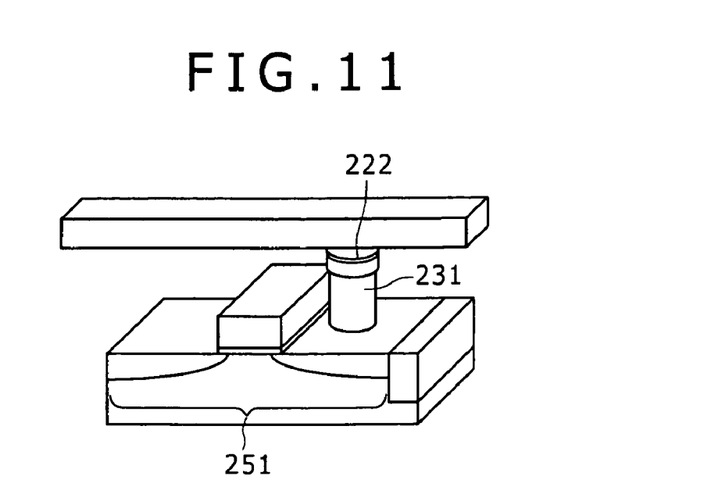
FIG. 11 is a schematic perspective view showing a structure of a SpinRAM in the past.

In the case of a non-volatile memory using spin injection magnetization reversal (SpinRAM), a wiring dedicated to a write operation using a current (write word line) is not necessary unlike the MRAM (here, indicating a magnetization reversal non-volatile memory by a current). For example, adoption of a structure (On-plug structure) in which a magnetic tunneling junction (MTJ) element 220 is disposed on a plug 231 on a selection transistor 251, as shown in FIG. 11, offers an advantage that a memory cell array can be made smaller. Thus, this On-plug structure is suitable for realizing a high integration level and a large capacity.

Now, a method including processing the overall MTJ at a time is considered as a method of manufacturing the On-plug structure. When reactive ion etching (RIE) is utilized, which is mainly used in the chemical etching processing, a kind of gas corresponding to a material has to be selected because the MTJ element has the complicated material structure. As a result, it is feared that the difficult problem of a tunnel barrier layer (made of an insulator such as $Al_2O_3$ or MgO) being damaged by a corrosion gas may arise, so that the characteristics of the MTJ element maybe deteriorated.

On the other hand, the physical etching processing typified by the ion milling is the desirable processing because it is not necessary to select a kind of gas and thus the damage received by the tunnel barrier layer is less. However, under a condition in which a conversion difference due to a shadow effect is reduced (in a region in which inactive gas ions are applied to a wafer in a nearly vertical direction), an amount of reaction product reattached is large, and the reattachment is attached to the tunnel barrier layer. As a result, the MTJ element becomes defective due to a short-circuit caused between a recording layer and a reference layer. This is still another problem.

Figure 12:
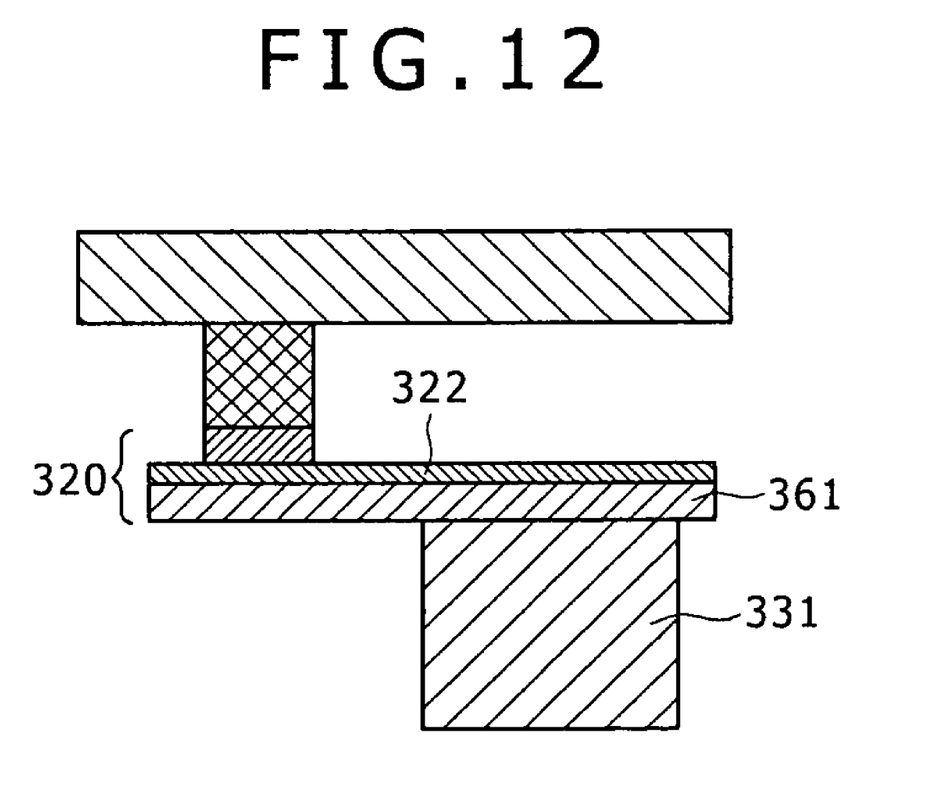
FIG. 12 is a schematic cross sectional view showing a structure of a SpinRAM having a bias wiring in the past.

In order to avoid the above-mentioned anxiety item, as shown in FIG. 12, one process has to be added to the processes in the related art. This process includes stopping the processing for a magnetic tunneling junction (MTJ) element 320 within a tunnel barrier layer 322, and forming a bypass wiring 361 through which a plug 331 and the MTJ element 320 are connected to each other. However, in this case, not only a distance to an adjacent element becomes large, so that a photo resist process allowing the alignment to be made with high precision is demanded, but also an actual cell size becomes larger than an ideal one. As a result, it becomes difficult to realize the large capacity due to the high integration.

SUMMARY OF THE INVENTION

A problem to be solved is that while the tunnel barrier layer and the lower layer or layers laying below the tunnel barrier layer are processed, the tunnel barrier layer is corroded, and the reaction product is attached to the tunnel barrier layer to cause a short-circuit between the recording layer and the reference layer.

In the light of the foregoing, it is desirable to make a large capacity promotion for a magnetic memory due to high integration promotion for a magnetic tunneling junction element possible by preventing the corrosion of a tunnel barrier layer and attaching a reaction product to the tunnel barrier layer.

According to an embodiment of the present invention, there is provided a magnetic memory including a magnetic tunneling junction element having a reference layer, a tunnel barrier layer and a recording layer laminated in order, with information being written to the recording, magnetization free layer in accordance with spin injection magnetization reversal caused by a current, and information written to the recording, magnetization free layer being read out using a current. The magnetic tunneling junction element is disposed on a plug connected to a selection transistor, and a sidewall insulating film covering a side portion of the recording layer of the magnetic tunneling junction element is formed.

In the magnetic memory according to the embodiment of the present invention, since the sidewall insulating film covering the side portion of the recording layer is formed, the recording, magnetization free layer is insulated from the reference, magnetization fixing layer through the sidewall insulating film. Therefore, even when the magnetic tunneling junction element is placed in an ambient atmosphere of reattachment of a reaction product, a short-circuit is prevented from being caused between the recording layer and the reference layer. In addition, when the tunnel barrier layer and a lower layer or layers lying below the tunnel barrier layer are processed by using the sidewall insulating film as a mask, a margin for alignment between the plug and the magnetic tunneling junction element, that is, a margin for mask alignment is obtained by the thickness of the sidewall insulating film.

According to another embodiment of the present invention, there is provided a method of manufacturing a magnetic memory including a magnetic tunneling junction element having a reference layer, a tunnel barrier layer and a recording layer laminated in order, with information being written to the recording layer in accordance with spin injection magnetization reversal caused by a current, and information written to the recording layer being read out using a current, for the magnetic tunneling junction element. The method includes the steps of: laminating a formation layer intended to become a reference layer, a formation layer intended to become a tunnel barrier layer and a formation layer intended to become a recording layer in order on a plug connected to a selection transistor; and processing the formation layer intended to become a recording layer into a recording layer of the magnetic tunneling junction element. The method further includes the steps of forming a sidewall insulating film covering a side portion of the recording layer; and processing the formation layer intended to become a tunnel barrier layer and the formation layer intended to become a reference layer by using the sidewall insulating film as a mask into a tunnel barrier layer and a reference layer of the magnetic tunneling junction element.

Since the method of manufacturing a magnetic memory according to the another embodiment of the present invention includes the step of forming a sidewall insulating film covering a side portion of a recording, magnetization free layer, the recording layer is coated with the sidewall insulating film. Therefore, while the tunnel barrier layer and the layer or layers lying below the tunnel barrier layer are processed, the side portion of the recording layer is protected by the sidewall insulating film. Thus, even when a reaction product is generated, the recording layer and the reference, magnetization fixing layer are isolated from each other through the sidewall insulating film. In addition, even when the magnetic tunneling junction element is placed in a corrosion ambient atmosphere, corrosion is prevented from progressing to a region in which the corrosion of the tunnel barrier layer exerts a bad influence on the characteristics. In addition, the tunnel barrier layer and the reference layer underlying the tunnel barrier layer are processed by using the sidewall insulating film as a mask. Therefore, a margin for alignment between the plug and the magnetic tunneling junction element, that is, a margin for mask alignment, is obtained by the thickness of the sidewall insulating film.

According to still another embodiment of the present invention, there is provided a semiconductor integrated circuit apparatus having a magnetic memory. The magnetic memory is installed in which the magnetic memory includes a magnetic tunneling junction element having a reference layer, a tunnel barrier layer and a recording layer laminated in order, with information being written to the recording layer in accordance with spin injection magnetization reversal caused by a current, and information written to the recording layer being read out using a current. The magnetic tunneling junction element is disposed on a plug connected to a selection transistor; and a sidewall insulating film covering a side portion of the recording layer of the magnetic tunneling junction element is formed.

The semiconductor integrated circuit apparatus according to the still another embodiment of the present invention includes the magnetic memory according to the embodiment of the present invention. Therefore, similarly to the magnetic memory according to the embodiment of the present invention, the recording, magnetization free layer is isolated from the reference, magnetization fixing layer through the sidewall insulating film. Thus, even when the magnetic tunneling junction element is placed in the ambient atmosphere of reattachment of the reaction product, the short-circuit is prevented from being caused between the recording layer and the reference layer. In addition, when the tunnel barrier layer and a lower layer or layers lying below the tunnel barrier layer are processed by using the sidewall insulating film as a mask, a margin for alignment between the plug and the magnetic tunneling junction element, that is, a margin for mask alignment, is obtained by the thickness of the sidewall insulating film.

According to the embodiment of the present invention, the high reliability can be obtained since formation of the sidewall insulating film allows the short-circuit defect or the corrosion defect to be avoided. In addition, the magnetic tunneling junction element and the plug are connected to each other in a self alignment manner because the tunnel barrier layer and the lower film or films lying below the tunnel barrier layer are processed by using the sidewall insulating film as the mask. Moreover, an area occupied by the sidewall insulating film comes to correspond to a cell size of the magnetic tunneling junction element. Therefore, an interval of the magnetic tunneling junction elements can be made a minimum pitch without taking the alignment margin into consideration. As a result, an advantage is obtained such that the high integration promotion and the large capacity promotion can be realized.

According to the another embodiment of the present invention, the high reliability can be obtained since formation of the sidewall insulating film allows the short-circuit defect or the corrosion defect to be avoided. In addition, the magnetic tunneling junction element and the plug can be connected to each other in a self alignment manner because the tunnel barrier layer and the layer or layers lying below the tunnel barrier layer are processed by using the sidewall insulating film as the mask. Also, an interval of the magnetic tunneling junction elements can be made a minimum pitch without taking the alignment margin into consideration. As a result, an advantage is obtained such that the high integration promotion and the large capacity promotion can be realized.

According to the another embodiment of the present invention, the magnetic memory according to the embodiment of the present invention is installed in the semiconductor integrated circuit apparatus. Therefore, an advantage is obtained such that the high reliability can be obtained and the high integration promotion and the large capacity promotion can be realized.

DETAILED DESCRIPTION OF THE PREFERRED EMBODIMENTS

A magnetic memory according to a first embodiment of the present invention will be described in detail hereinafter with reference to a schematic cross sectional view of FIG. 1.

Figure 1:
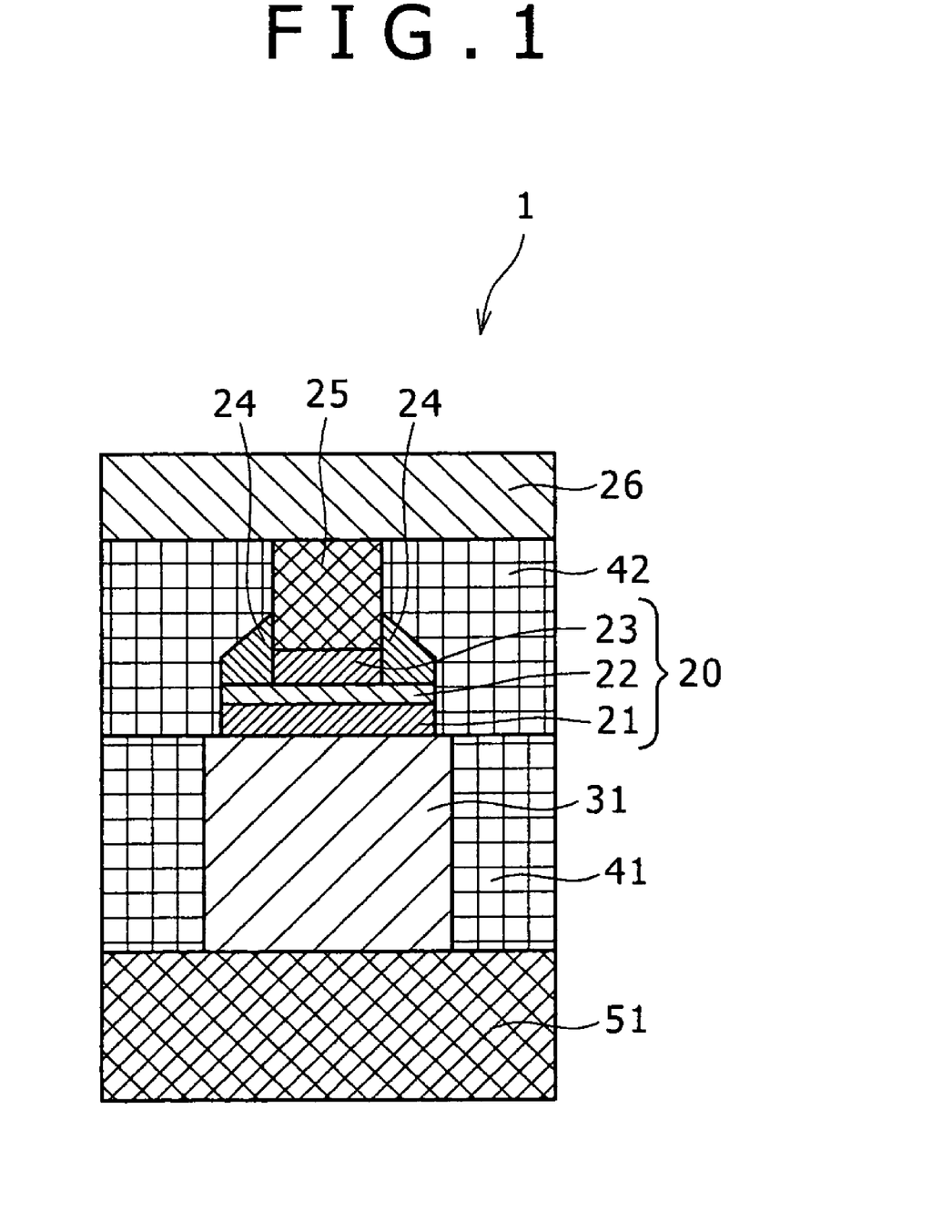
FIG. 1 is a schematic cross sectional view showing a structure of a magnetic memory according to a first embodiment of the present invention.

As shown in FIG. 1, a plug 31 is formed on a diffusion layer 51 of a selection transistor. The plug 31 is formed so as to extend completely through an insulating film 41. A magnetic tunneling junction element 20 is formed on the plug 31. In the magnetic tunneling junction element 20, information is written to a recording layer 23 in accordance with spin injection magnetization reversal caused by a current, and information written to the recording layer 23 is read out by using a current. The magnetic tunneling junction element 20 is formed by laminating a reference layer (magnetization fixing layer) 21, a tunnel barrier layer 22, and the recording layer (magnetization free layer) 23 in order from a lower layer. A sidewall insulating film 24 covering a sidewall of the recording layer 23 is formed on the tunnel barrier layer 22. In addition, a conductive portion 25 is formed on the magnetic tunneling junction element 20. In addition, a conductive portion 25 is formed on the magnetic tunneling junction element 20. Moreover, an insulating film 42 is formed on the above-mentioned insulating film 41. Here, the magnetic tunneling junction element 20 and the conductive portion 25 are buried in the insulating film 42, and a surface of the conductive portion 25 is exposed from the insulating film 42. Also, a bit line 26, which is connected to the magnetic tunneling junction element 20 through the conductive portion 25, is formed on the insulating film 42.

The reference layer 21, for example, has a strong unidirectional magnetic anisotropy. For example, the reference layer 21 is made of one kind of ferromagnetic material that is selected from the group consisting of an iron-manganese alloy, a nickel-manganese alloy, a platinum-manganese alloy, an iridium-manganese alloy, a rhodium-manganese alloy, a cobalt oxide, a nickel oxide, and the like.

The tunnel barrier layer 22 is made of an oxide, such as an aluminum oxide ($Al_2O_3$), or a magnesium oxide (MgO), a nitride, such as an aluminum nitride (AlN), a silicon nitride ($Si_3N_4$) or a magnesium nitride (MgN), or an oxynitride, such as aluminum oxynitride, or a magnesium oxynitride. The tunnel barrier layer 22 has a function of decoupling a magnetic coupling between the recording layer 23 and the reference layer 21 and causing a tunnel current to flow therethrough. These magnetic films and conductor films are mainly formed by utilizing a sputtering method. The tunnel barrier layer 22 can be obtained by oxidizing, nitriding or oxy-nitriding a metallic film formed by utilizing the sputtering method.

The recording layer 23, for example, is made of a ferromagnetic material, such as nickel, iron or cobalt, or an alloy containing at least two kinds of materials of nickel, iron and cobalt.

The sidewall insulating film 24 is made of an oxide insulating film or a nitride insulating film. An aluminum oxide ($Al_2O_3$), for example, is used as the oxide insulating film, and a silicon nitride ($Si_3N_4$), for example, is used as the nitride insulating film.

In addition, when a wiring layer (not shown) is formed in a copper wiring process, the plug 31 is made of, for example, copper or a copper alloy. Also, when the wiring layer (not shown) is formed in an aluminum (Al) wiring process, the plug 31 is made of, for example, is made of tungsten (W).

The conductive portion 25 acts as a hard mask when the magnetic tunneling junction element is formed, and is made, for example, of titanium (Ti) or a titanium nitride (TiN). Alternatively, the conductive portion 25 may also be made of, for example, tantalum (Ta) or a tantalum nitride (TaN) depending on a method of processing the magnetic tunneling junction element, especially a kind of gas for reactive ion etching (RIE). In this embodiment, any suitable material for the conductive portion 25 is selected from the above-mentioned materials. It is selected therefrom so that the conductive portion 25 has a function of electrically connecting the bit line 26 and the magnetic tunneling junction element 20 to each other and a mask function when the magnetic tunneling junction element 20 is processed. However, when the mask (not shown) is formed separately from the conductive portion 25, the conductive portion 25 may also be made of a conductive material containing a metal or a metallic compound other than the above-mentioned metals or metal compounds. In addition, when the mask (not shown) is formed separately therefrom, the conductive portion 25 is made of, for example, ruthenium, copper, chromium, gold, silver or the like.

In the magnetic tunneling junction element 20, the sidewall insulating film 24 covering the side portion of the recording layer 23 is formed. Thus, the recording layer 23 is isolated from the reference layer 21 through the sidewall insulating film 24. Therefore, even when the magnetic tunneling junction element 20 is placed in the ambient atmosphere of reattachment of the reaction product, the short-circuit is prevented from being caused between the recording layer 23 and the reference layer 21. In addition, when the tunnel barrier layer 22 and the lower layer underlying the tunnel barrier layer 22 are processed by using the sidewall insulating film 24 as a mask, the margin for the alignment between the plug 31 and the magnetic tunneling junction element 20, that is, the margin for the mask alignment, is obtained by the thickness of the sidewall insulating film 24.

Therefore, according to the magnetic tunneling junction element 20, the high reliability is obtained because the formation of the sidewall insulating film 24 allows the short-circuit defect or the corrosion defect to be avoided. In addition, the magnetic tunneling junction element 20 and the plug 31 are connected to each other in a self-alignment manner because the lower layers are processed by using the sidewall insulating film 24 as the mask. Moreover, an area occupied by the sidewall insulating film 24 comes to correspond to a cell size of the magnetic tunneling junction element 20. Therefore, an interval of the magnetic tunneling junction elements 20 can be made a minimum pitch without taking the alignment margin into consideration. As a result, an advantage is offered such that the high integration promotion and the large capacity promotion can be realized.

Next, a method of manufacturing the magnetic memory of the first embodiment according to a second embodiment of the present invention will be described in detail with reference to cross sectional views of FIGS. 2A to 2E showing manufacturing processes.

Figure 2A:
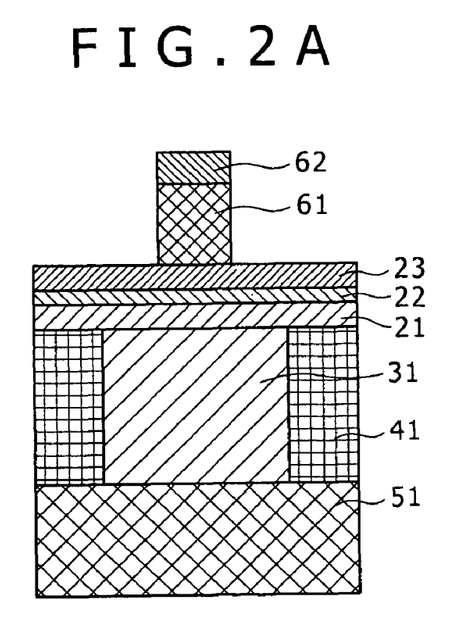
FIGS. 2A to 2E are respectively cross sectional views showing processes in a method of manufacturing a magnetic memory according to a second embodiment of the present invention.

As shown in FIG. 2A, after elements such as a transistor, a wiring (not shown) and the like are formed, the insulating film 41 is formed so as to cover the diffusion layer 51 of the selection transistor. Also, the plug 31 is formed so as to extend completely through the insulating film 41. Here, the transistor, the wiring and the like may be formed in a copper wiring process, or may be formed in an aluminum wiring process. Copper or any other suitable alloy thereof is used in the copper wiring process, and tungsten (W) is used in the aluminum wiring process.

The reference layer (magnetization fixing layer) 21, the tunnel barrier layer 22, and the recording layer (magnetization free layer) 23 are laminated in order from the lower layer so as to cover the plug 31 and the insulating film 41. The sputtering method, the vacuum evaporation method, the CVD method or the like is utilized for deposition of these films. Moreover, a first hard mask 61 and a second hard mask 62 are laminated in this order on the reference layer 21.

Next, the second hard mask 62 and the first hard mask 61 are processed into a mask shape which is used when the magnetic tunneling junction element is formed in the necessary processing by, for example, utilizing the lithography technique and the etching technique. The first hard mask 61 has a conductive property so that it can be used as the plug. Thus, the first hard mask 61 becomes a protective film for the recording layer 23 when the sidewall insulating film is formed, and it is made of, for example, a metallic compound or a metal. A titanium nitride (TiN), a tantalum nitride (TaN) or the like, for example, can be used as the metallic compound. Titanium (Ti), tantalum (Ta) or the like, for example, can be used as the metal. In addition, the second hard mask 62 is made of an insulating film. For example, an oxide such as an aluminum oxide ($Al_2O_3$), a silicon oxide ($SiO_2$), a magnesium oxide (MgO) or a zirconium oxide ($ZrO_2$), a nitride such as a silicon nitride ($Si_3N_4$) or an aluminum nitride (AlN), a mixture thereof, or an oxynitride such as a silicon oxynitride (SiON), or an aluminum oxynitride (AlON) is given as the insulating film.

Figure 2B:
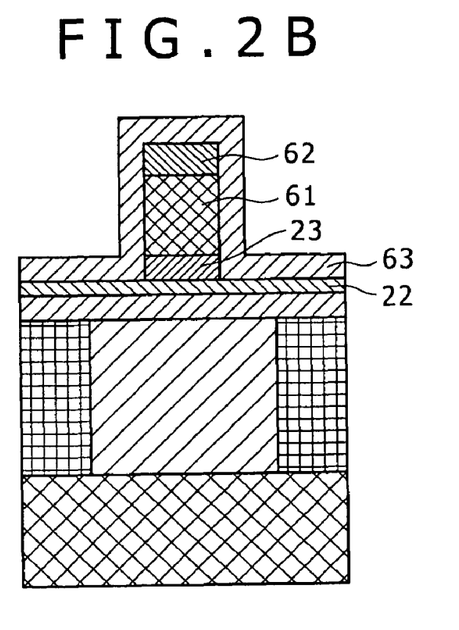

Next, as shown in FIG. 2B, the recording layer 23 is processed into a shape of the magnetic tunneling junction element by using the second hard mask 62 and the first hard mask 61 as a mask. Physical etching, such as ion milling, or chemical etching, such as RIE, is utilized in this process. In order to suppress the damage caused by the process as much as possible, the process is stopped within the tunnel barrier layer 22 (the recording layer 23 is processed).

Figure 3A:
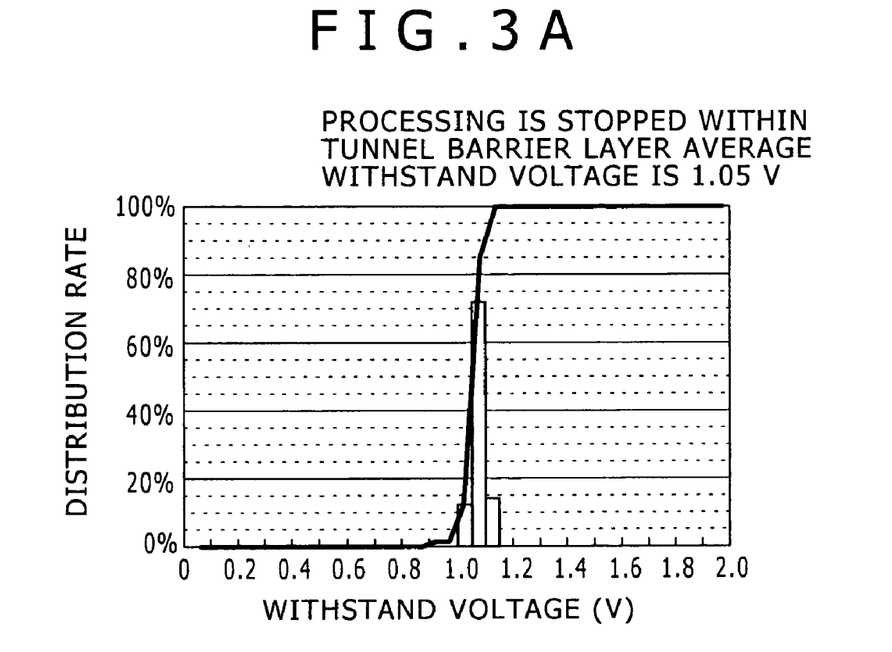
FIGS. 3A and 3B are respectively graphical representations showing withstand voltage distributions depending on processing positions in a magnetic tunneling junction element.
Figure 3B:
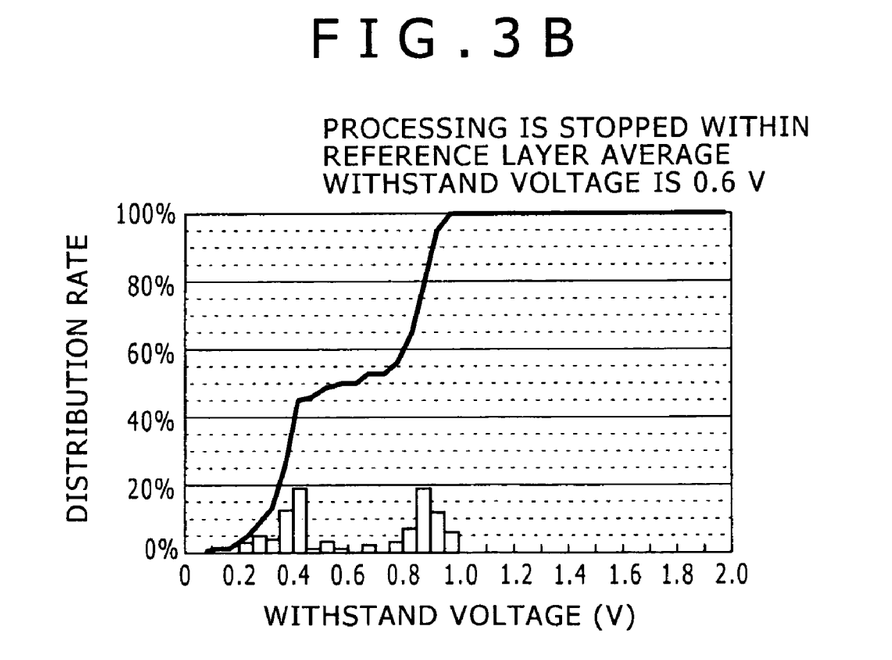

Here, FIGS. 3A and 3B show respectively graphical representations of withstand voltage distributions depending on processing positions in the magnetic tunneling junction element (MTJ element) 20 when the tunnel barrier layer 22 is made of a magnesium oxide (MgO). As shown in FIG. 3A, it is understood that when the processing is stopped within the tunnel barrier layer 22, an excellent withstand voltage distribution is obtained and a high average withstand voltage of 1.05 V is obtained. On the other hand, as shown in FIG. 3B, it is understood that when the processing is made to progress up to the reference layer 21, a poor withstand voltage distribution is obtained, and a low average withstand voltage of 0.6 V is obtained. Therefore, it is preferable to stop the processing within the tunnel barrier layer 22.

Next, as shown in FIG. 2B, an insulating film 63, which is intended to become the sidewall insulating film on the tunnel barrier layer 22, is formed so as to cover the second hard mask 62, the first hard mask 61 and the recording layer 23. The insulating film 63 is made of an oxide, such as an aluminum oxide ($Al_2O_3$), a silicon oxide ($SiO_2$), a magnesium oxide (MgO) or a zirconium oxide ($ZrO_2$), a nitride, such as a silicon nitride ($Si_3N_4$), or an aluminum nitride (AlN), a mixture thereof, or an oxynitride, such as a silicon oxynitride (SiON), or an aluminum oxynitride (AlON). In addition, when the insulating film 63, for example, is made of an aluminum oxide or a silicon nitride, there is obtained an effect of protecting the tunnel barrier layer 22 from being exposed to the reduction ambient atmosphere and the moisture. Incidentally, this effect is offered depending on the selection of the material for the insulating film 63. In addition, the insulating film 63 is formed by utilizing the sputtering method or the plasma CVD method. Also, the insulating film 63 has to have such a thickness that the insulating film 63 is left on the sidewall of the magnetic tunneling junction element after the tunnel barrier layer 22 and the lower layer underlying the tunnel barrier layer 22 are processed, and is enough to form the sidewall insulating film. The suitable thickness of the recording layer 23 differs depending on the etching method when the sidewall insulating film is formed. In this embodiment, for the insulating film 63, a silicon nitride film is deposited by utilizing the plasma CVD method so as to have a thickness of 50 to 100 nm.

Figure 2C:
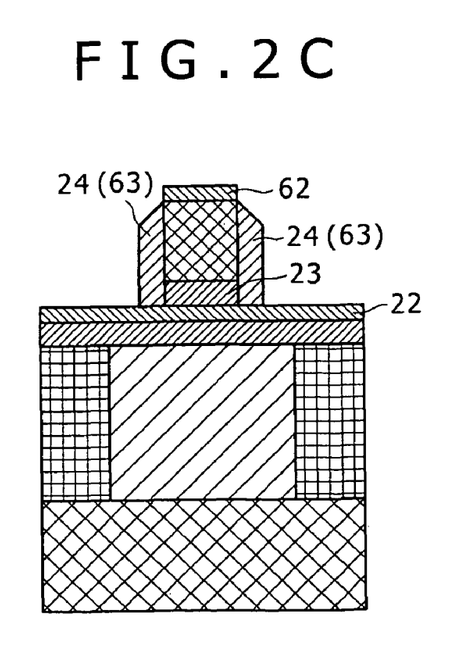

Next, as shown in FIG. 2C, the insulating film 63 is subjected to etch back to form the insulating film 63 into the sidewall insulating film 24 on the tunnel barrier layer 22. Here, the sidewall insulating film 24 is formed so as to cover the sidewall of the recording layer 23, that is, so as not to expose the recording layer 23. In the etch back, an anisotropic etching, for example, is used as the reactive ion etching (RIE) or the like. During the etch back, an upper portion or the entire second hard mask 62 is etched away.

Figure 2D:
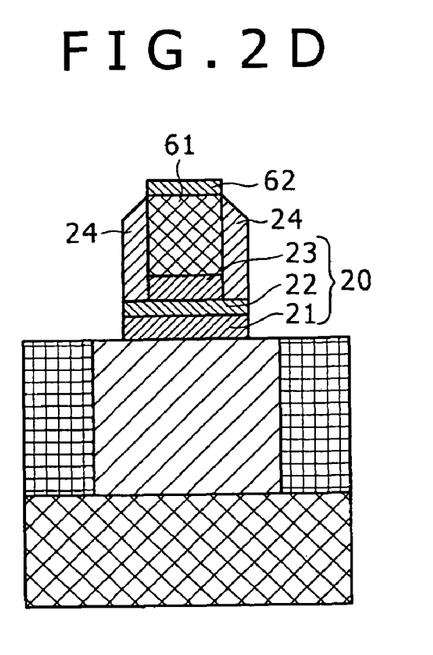

Next, as shown in FIG. 2D, the tunnel barrier layer 22 and the reference layer 21 are processed by using the sidewall insulating film 24, the second hard mask 62, the first hard mask 61 and the like as a mask. In such a manner, the magnetic tunneling junction element 20 is formed, which is obtained by laminating the reference layer 21, the tunnel barrier layer 22, and the recording layer 23 in this order.

Figure 2E:
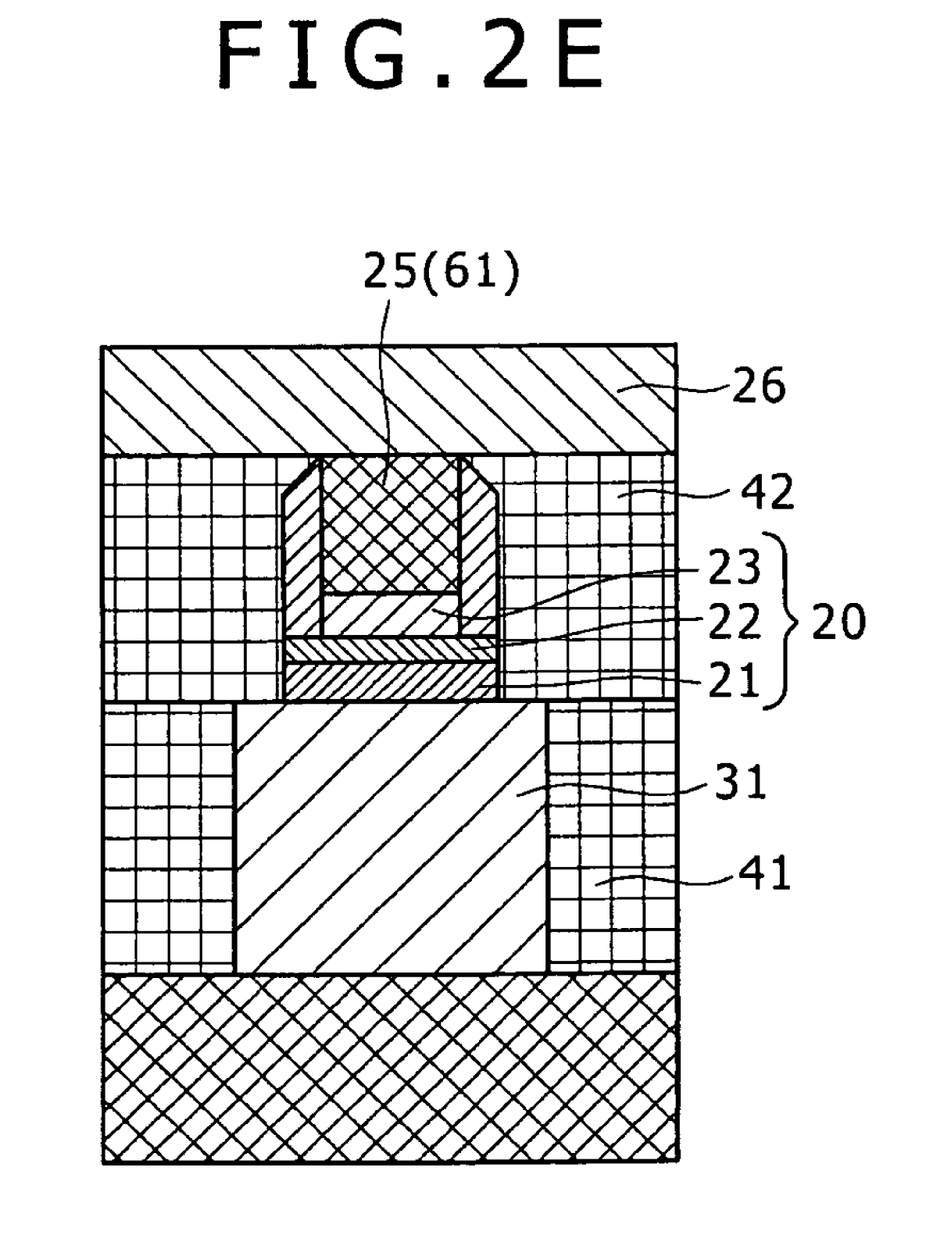

Next, as shown in FIG. 2E, the insulating film 42 covering the magnetic tunneling junction element 20 is formed on the insulating film 41. After that, a surface of the insulating film 42 is flattened to expose the first hard mask 61. The conductive portion 25 through which the magnetic tunneling junction element 20 and the bit line 26 which will be formed later are connected to each other is formed from the first hard mask 61. Thereafter, the bit line 26 connected to the conductive portion 25 is formed on the insulating film 42. As a result, the magnetic memory 1 is completed.

While details will be described later, the insulating film 63 also has a function of compensating for offset between the plug 31 and the magnetic tunneling junction element 20. Therefore, the insulating film 63 has to have such a thickness that while the tunnel barrier layer 22 and the reference layer 21 are processed, the recording layer 23 is prevented from being exposed due to the processing.

The method of manufacturing the magnetic memory as the second embodiment includes the step of forming the sidewall insulating film 24 covering the side portion of the recording layer (magnetization free layer) 23. Thus, since the recording layer 23 is coated with the sidewall insulating film 24, when the tunnel barrier layer 22 and the lower layer underlying the tunnel barrier layer 22 are processed, the side portion of the recording layer 23 is protected by the sidewall insulating film 24. Therefore, even when the reaction product is generated while the tunnel barrier layer and the magnetic layer underlying the tunnel barrier layer are processed, the recording layer 23 and the reference layer (magnetization fixing layer) 21 are isolated from each other through the sidewall insulating film 24. In addition, even when the magnetic tunneling junction element 20 is placed in the corrosion ambient atmosphere, corrosion is prevented from progressing to a region in which the corrosion of the tunnel barrier layer 22 exerts a bad influence on the characteristics. In addition, the tunnel barrier layer 22 and the reference layer 21 as the lower layer underlying the tunnel barrier layer 22 are processed by using the sidewall insulating film 24 as the mask. Therefore, the margin for the alignment between the plug 31 and the magnetic tunneling junction element 20, that is, the margin for the mask alignment, is obtained by the thickness of the sidewall insulating film 24. This respect will be described in detail later.

Therefore, the magnetic memory 1 can be manufactured reliably because the formation of the sidewall insulating film 24 allows the short-circuit defect or the corrosion defect to be avoided. In addition, the magnetic tunneling junction element 20 and the plug 31 are connected to each other in the self-alignment manner because the tunnel barrier layer 22 and the layer underlying the tunnel barrier layer 22 are processed by using the sidewall insulating film 24 as the mask. In addition, the interval of the magnetic tunneling junction elements 20 can be made the minimum pitch without taking the alignment margin into consideration. As a result, the advantage of a high integration promotion and the large capacity promotion being realized for the magnetic tunneling junction elements 20 is offered.

Note that, although in the second embodiment, the processing for formation of the magnetic tunneling junction element 20 is carried out by using the hard mask (the first hard mask 62), the processing for formation of the magnetic tunneling junction element 20 may also be carried out by using a photo resist as a mask. In this case, the second hard mask 62 becomes unnecessary, the photo resist mask is directly formed on the first hard mask 61 (the conductive portion 25), and the processing is carried out for formation from the conductive portion 25 to the tunnel barrier layer 22. Then, the photo resist mask is removed. After that, the processes in and after formation of the sidewall insulating film 24 has been described above may be carried out.

Figure 4:
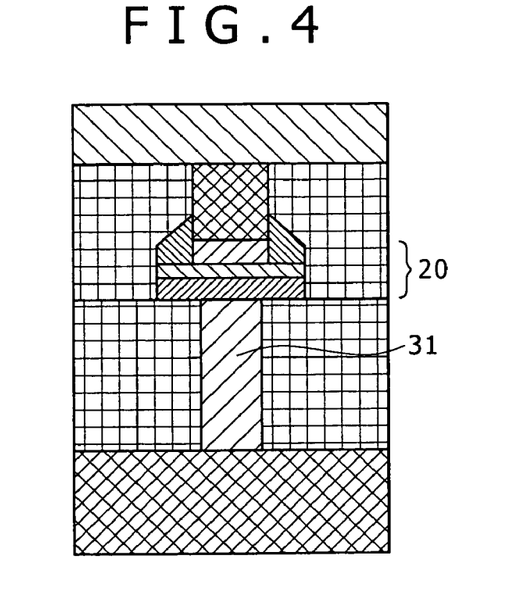
FIG. 4 is a cross sectional view showing a schematic structure of an example of a modification of the second embodiment of the present invention.

The case where the magnetic tunneling junction element 20 is smaller in size than the plug 31 has been described in the magnetic memory 1 in each of the first and second embodiments. However, even in the case where the magnetic tunneling junction element 20 is larger in size than the plug 31, as shown in FIG. 4, the magnetic memory 1 can be manufactured similarly to the case of the manufacturing processes in the second embodiment. Therefore, the magnetic tunneling junction element 20 may be larger in size than the plug 31 in the structure in the above-mentioned first embodiment.

Next, a description will be given with respect to the offset between the magnetic tunneling junction element 20 and the plug 31.

Figure 5:
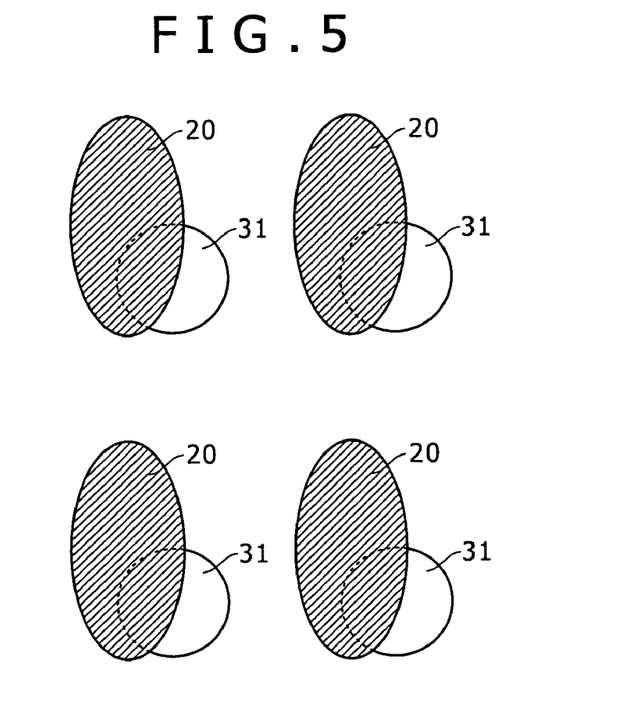
FIG. 5 is a layout diagram showing offset between the magnetic tunneling junction element and a plug.

When the offset between the magnetic tunneling junction element 20 and the plug 31 is large, as shown in FIG. 5, with the method of carrying out the processing for formation of the overall magnetic tunneling junction element 20 at a time, the resistance value becomes large to cause the resistance defect.

Figure 6:
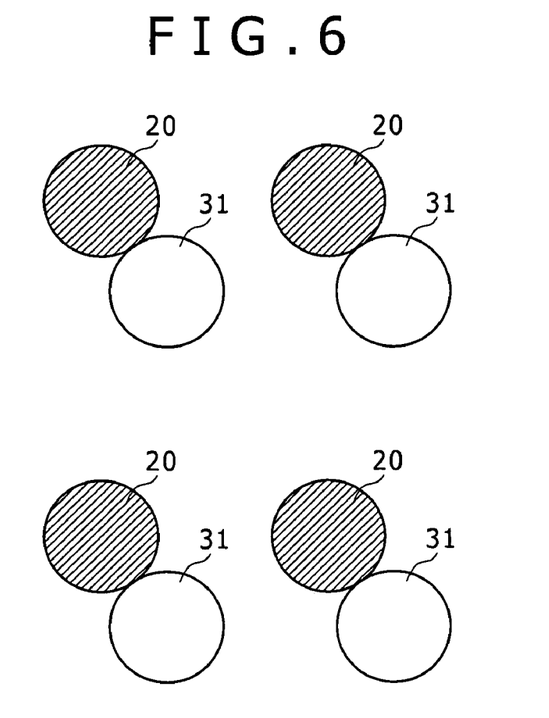
FIG. 6 is another layout diagram showing offset between the magnetic tunneling junction element and the plug.

The reason for this is that a portion in which the magnetic tunneling junction element 20 overlaps a contact becomes small depending on an amount of offset. In addition, when there is no portion in which the magnetic tunneling junction element 20 and the plug 31 overlap each other, as shown in FIG. 6, an open defect is caused in some cases. In particular, when the diameter of the magnetic tunneling junction element 20 becomes equal to or smaller than 100 nm and the diameter of the plug 31 becomes equal to or smaller than 100 nm$\phi$, the highly precise alignment of 50 nm or less is demanded.

Figure 7:
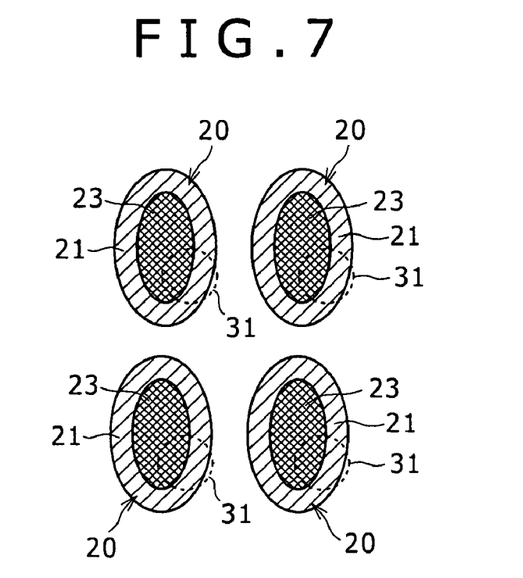
FIG. 7 is a layout diagram showing offset between the magnetic tunneling junction element and the plug when a sidewall insulating film is formed.
Figure 8:
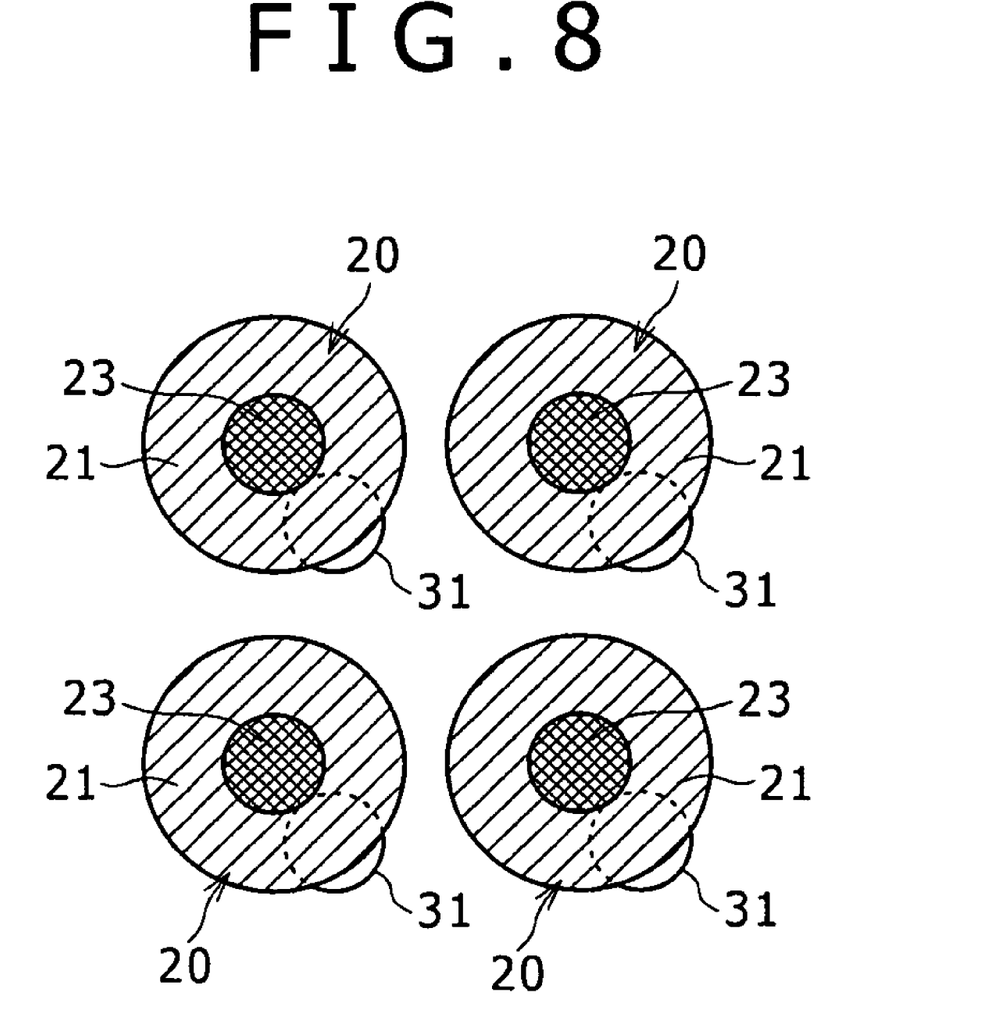
FIG. 8 is another layout diagram showing offset between the magnetic tunneling junction element and the plug when a sidewall insulating film is formed.

In order to solve the problem, the structure of forming the sidewall insulating film of the present invention has to be adopted. Specifically, the insulating film 63 has to be formed in consideration of an amount of maximum offset in the phase of formation of the sidewall insulating film 24. For example, when the diameter of the recording layer 23 of the magnetic tunneling junction element 20 is 100 nm$\phi$, the diameter of the plug 31 is 100 nm$\phi$, and the amount of maximum offset is 100 nm, the insulating film 63 has to be deposited so that the sidewall insulating film (not shown) 24 has a thickness of 100 nm. At this time, as shown in FIGS. 7 and 8, the magnetic film (e.g., the reference layer 21) underlying the tunnel barrier layer 22 has a part (bypass wiring) of the wiring through which the magnetic tunneling junction element 20 and the plug 31 are connected to each other.

An example of a minimum thickness of the insulating film 63 when the sidewall insulating film 24 is formed will now be given as follows. Firstly, when process damage is prevented from being caused, and when the insulating film 63 is made of an aluminum oxide ($Al_2O_3$), the insulating film 63 has to be formed to have a thickness of 20 nm or more. In addition, when the insulating film 63 is made of a plasma-deposited silicon nitride (P-SiN), it needs to have a thickness of 30 nm or more. Moreover, when corresponding to the offset between the magnetic tunneling junction element 20 and the plug 31, the larger one is adopted after a value of "the amount of offset+10 nm" and a value of each of the materials when the process damage is prevented are compared with each other. Here, the reason for setting of "the amount of offset+10 nm" is because an amount of margin demanded to reliably make the contact in consideration of the processing dispersion and the like as well is 10 nm.

The magnetic memory 1 that has been described so far can be applied to a semiconductor integrated circuit apparatus in which, for example, a magnetic memory and a logic circuit are installed.

Figure 9:
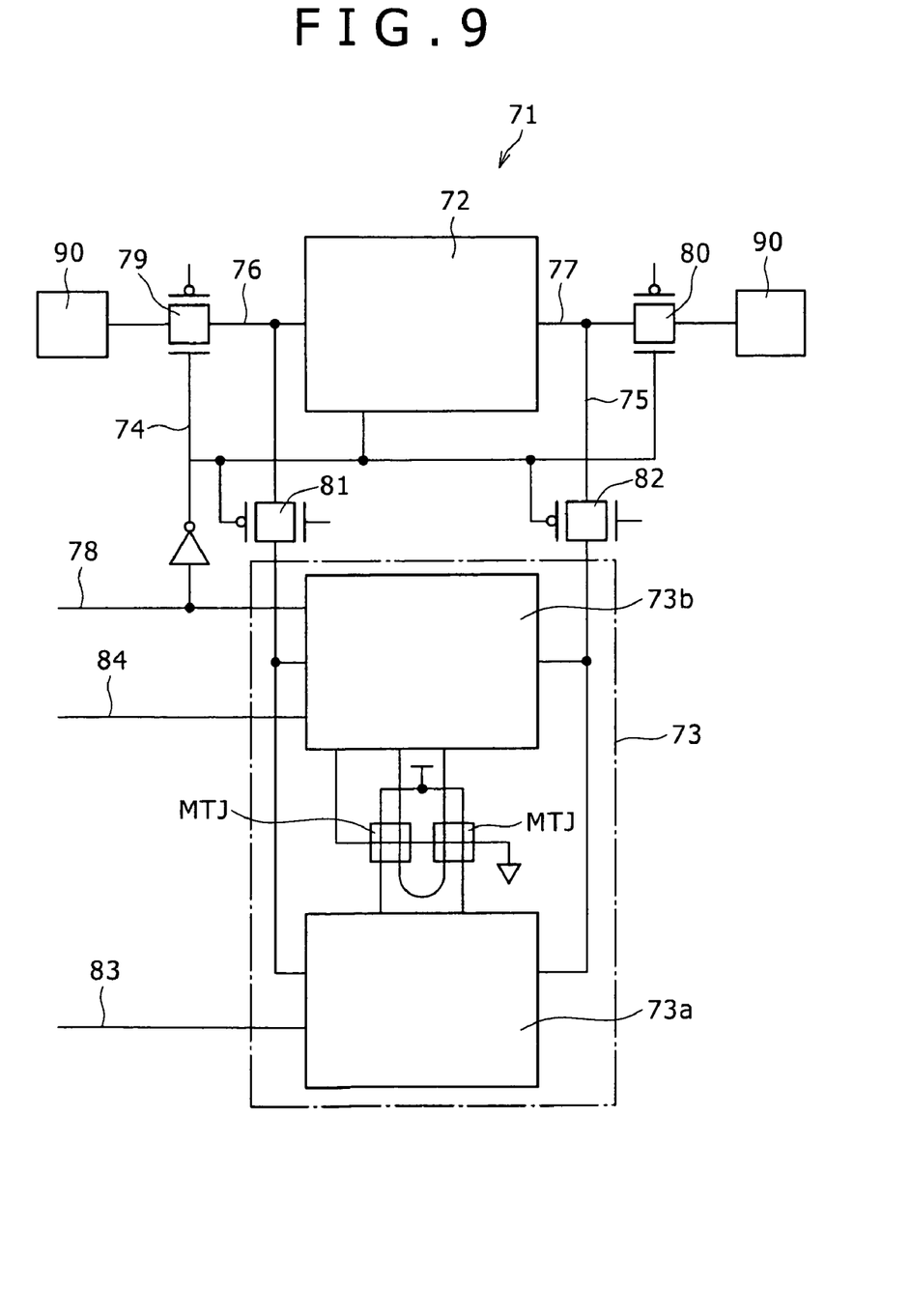
FIG. 9 is a circuit diagram showing a configuration of a semiconductor integrated circuit apparatus according to a third embodiment of the present invention.

Next, a semiconductor integrated circuit apparatus according to a third embodiment of the present invention will now be described in detail with reference to a circuit diagram of FIG. 9. FIG. 9 shows a circuit configuration of a complex memory circuit apparatus as a semiconductor integrated circuit apparatus.

As shown in FIG. 9, a semiconductor integrated circuit apparatus 71 is configured such that a volatile memory circuit 72 and a non-volatile memory circuit 73 are connected in parallel with each other through a first connection line 74 and a second connection line 75. The volatile memory circuit 72 and the non-volatile memory circuit 73, for example, are formed on a semiconductor substrate. In addition, the volatile memory circuit 72, for example, is structured in the form of a latch type memory circuit formed on a system LSI chip.

A first wiring 76 and a second wiring 77 through which the volatile memory circuit 72 is connected to any other suitable memory circuits 90 or elements are connected to the volatile memory circuit 72. A first circuit change-over switch 79 and a second circuit change-over switch 80, each of which is connected to a power source disconnection signal inputting line 78, are connected to the first wiring 76 and the second wiring 77, respectively. Opening and closing in the first circuit change-over switch 79 and the second circuit change-over switch 80 are changed over to each other in accordance with the input of a power source disconnection signal transmitted over the power source disconnection signal inputting line 78.

A first connection line 74 having one end connected to the first wiring 76 is connected to the first wiring 76 between the volatile memory circuit 72 and the first circuit change-over switch 79. In addition, a second connection line 75 having one end connected to the second wiring 77 is connected to the second wiring 77 between the volatile memory circuit 72 and the second circuit change-over switch 80.

In addition, a third circuit change-over switch 81 and a fourth circuit change-over switch 82, each of which is connected to the power source disconnection signal inputting line 78, are connected to the first connection line 74 and the second connection line 75, respectively. Opening and closing in the third circuit change-over switch 81 and the fourth circuit change-over switch 82 are changed over to each other in accordance with the input of a power disconnection signal transmitted over the power source disconnection signal inputting line 78. The third circuit change-over switch 81 and the fourth circuit change-over switch 82 are provided between the volatile memory circuit 72 and the non-volatile memory circuit 73.

Information of "0" or "1" is stored in the non-volatile memory circuit 73 by using magnetic tunneling junction elements MTJs. The magnetic tunneling junction element 20 (refer to FIG. 1), as described in the first embodiment, in which the sidewall insulating film covering the sidewall of the recording layer is formed, for example, is used as the magnetic tunneling junction element MTJ. Note that, in order that the latch type memory circuit as the volatile memory circuit 72 may store therein 2-bits information, the two magnetic tunneling junction elements MTJs are provided, so that even the non-volatile memory circuit 73 can store therein the 2-bits information.

An information reading circuit 73a and an information writing circuit 73b are connected to each of the two magnetic tunneling junction elements MTJs. Here, the information reading circuit 73a reads out information from the magnetic tunneling junction elements MTJs. Also, the information writing circuit 73b writes information to the magnetic tunneling junction elements MTJs. The information reading circuit 73a and the information writing circuit 73b are connected to the volatile memory circuit 72 through the first connection line 74 and the second connection line 75.

A read start signal inputting line 83 is connected to the information reading circuit 73a. Thus, a read start signal is inputted to the read start signal inputting line 83, thereby reading out information from the magnetic tunneling junction elements MTJs.

A write start signal inputting line 84 is connected to the information writing circuit 73b. Thus, a write start signal is inputted to the write start signal inputting line 84, thereby storing information stored in the volatile memory circuit 72 in the magnetic tunneling junction elements MTJs.

In addition, the power source disconnection signal inputting line 78 is connected to the information writing circuit 73b. Moreover, the power source disconnection signal inputting line 78 is also connected to the volatile memory circuit 72.

The semiconductor integrated circuit apparatus 71 is provided with the magnetic tunneling junction element 20 of the magnetic memory 1 according to the first embodiment of the present invention. Thus, similarly to the magnetic memory 1 according to the first embodiment of the present invention, the recording layer (magnetization free layer) is isolated from the reference layer (magnetization fixing layer) through the sidewall insulating film. Therefore, even when the magnetic tunneling junction element 20 is placed in the ambient atmosphere of reattachment of the reaction product, the short-circuit is prevented from being caused between the recording layer and the reference layer. In addition, when the tunnel barrier layer and the lower layer underlying the tunnel barrier layer are processed by using the sidewall insulating film as the mask, the margin for the alignment between the plug and the magnetic tunneling junction element, that is, the margin for the mask alignment, is obtained by the thickness of the sidewall insulating film. Accordingly, the semiconductor integrated circuit apparatus 71 has the advantages that a high reliability can be obtained and also a high integration promotion and a high capacity promotion can be realized.

In addition, the magnetic memory according to the first embodiment of the present invention can be adopted as the non-volatile memory used in the semiconductor integrated circuit apparatus. Thus, similarly to the foregoing, the semiconductor integrated circuit apparatus 71 has the advantages that a high reliability can be obtained and also a high integration promotion and a high capacity promotion can be realized.

It should be understood by those skilled in the art that various modifications, combinations, sub-combinations and alterations may occur depending on design requirements and other factors insofar as they are within the scope of the appended claims or the equivalents thereof.

What is claimed is:

1. A magnetic memory comprising:
a magnetic tunneling junction element having a reference layer, a tunnel barrier layer and a recording layer laminated in order, with information being written to said recording layer in accordance with spin injection magnetization reversal caused by a current, and information written to said recording layer being read out using a current,
wherein said magnetic tunneling junction element is disposed on a plug connected to a selection transistor; and
a sidewall insulating film covering a side portion of said recording layer and overlying a surface portion of said tunnel barrier layer of said magnetic tunneling junction element, and
wherein a thickness of said sidewall insulating film is the larger of a thickness value obtained by adding an offset margin to an amount of offset between said magnetic tunneling junction element and said plug and a thickness value of a film for protecting said recording layer, and
wherein said offset margin is 10 nm or less.

2. The magnetic memory according to claim 1, wherein said reference layer and said tunnel barrier layer, which are below said recording layer that is regulated by said sidewall insulating film, become a wiring through which said plug and said magnetic tunneling junction element are connected to each other.

3. A semiconductor integrated circuit apparatus having a magnetic memory installed,
wherein said magnetic memory includes a magnetic tunneling junction element having a reference layer, a tunnel barrier layer and a recording layer laminated in order, with information being written to said recording layer in accordance with spin injection magnetization reversal caused by a current, and information written to said recording layer being read out using a current;

said magnetic tunneling junction element is disposed on a plug connected to a selection transistor; and
a sidewall insulating film covering a side portion of said recording layer of said magnetic tunneling junction element is formed,
wherein a thickness of said sidewall insulating film is the larger of a thickness value obtained by adding an offset margin to an amount of offset between said magnetic tunneling junction element and said plug and a thickness value of a film for protecting said recording layer, and wherein said offset margin is 10 nm or less.

* * * * *